(12) United States Patent
Nakajima et al.

(10) Patent No.: US 6,979,843 B2
(45) Date of Patent: Dec. 27, 2005

(54) POWER SEMICONDUCTOR DEVICE

(75) Inventors: Dai Nakajima, Tokyo (JP); Yoshihiro Kashiba, Tokyo (JP); Hideaki Chuma, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/383,650

(22) Filed: Mar. 10, 2003
(Under 37 CFR 1.47)

(65) Prior Publication Data

US 2003/0213979 A1    Nov. 20, 2003

(30) Foreign Application Priority Data

Mar. 8, 2002  (JP) .......................... P2002-063484

(51) Int. Cl.[7] .......................................... H01L 31/111
(52) U.S. Cl. ..................... 257/182; 257/179; 257/712; 257/718
(58) Field of Search ............................. 257/678, 713, 257/723, 787, 179, 182, 712, 718

(56) References Cited

U.S. PATENT DOCUMENTS

| | | | | |
|---|---|---|---|---|
| 5,258,649 A | * | 11/1993 | Tanaka et al. | 257/787 |
| 5,528,458 A | * | 6/1996 | Yasuho et al. | 361/718 |
| 5,646,445 A | * | 7/1997 | Masumoto et al. | 257/723 |
| 6,166,937 A | * | 12/2000 | Yamamura et al. | 363/141 |
| 6,215,176 B1 | | 4/2001 | Huang | |
| 6,291,880 B1 | * | 9/2001 | Ogawa et al. | 257/723 |
| 6,369,411 B2 | * | 4/2002 | Matsumoto | 257/182 |
| 6,573,119 B1 | * | 6/2003 | Hirashima et al. | 438/64 |

FOREIGN PATENT DOCUMENTS

| | | | |
|---|---|---|---|
| EP | 0 810 660 A1 | 12/1997 | |
| JP | 55-65450 | 5/1980 | |
| JP | 06-104355 | 4/1994 | |
| JP | 08-64634 | 3/1996 | |
| JP | 2566480 | 12/1997 | |
| JP | 10-22435 | 1/1998 | |
| JP | P2001-203321 | 7/2001 | |
| US | 2002/0125553 | * 9/2002 | 257/678 |
| US | 2002/0185718 | * 12/2002 | 257/678 |

* cited by examiner

Primary Examiner—David Nelms
Assistant Examiner—Dao H. Nguyen
(74) Attorney, Agent, or Firm—Oblon, Spivak, McClelland, Maier & Neustadt, P.C.

(57) ABSTRACT

A power semiconductor device that uses a lead frame for making connection to a semiconductor device and has a structure less subject to fatigue failure at the connection part of the lead frame. A mold resin of a casing (14) is used for integrally covering the lead frame (6, 7, 13), semiconductor device (1), and metal block (15) serving as a substrate mounting the semiconductor device (1). The mold resin surrounding the lead frame (6) and semiconductor device (1) strengthens the joint therebetween, resulting in the power semiconductor device less subject to fatigue failure at the connection part of the lead frame (6).

13 Claims, 14 Drawing Sheets

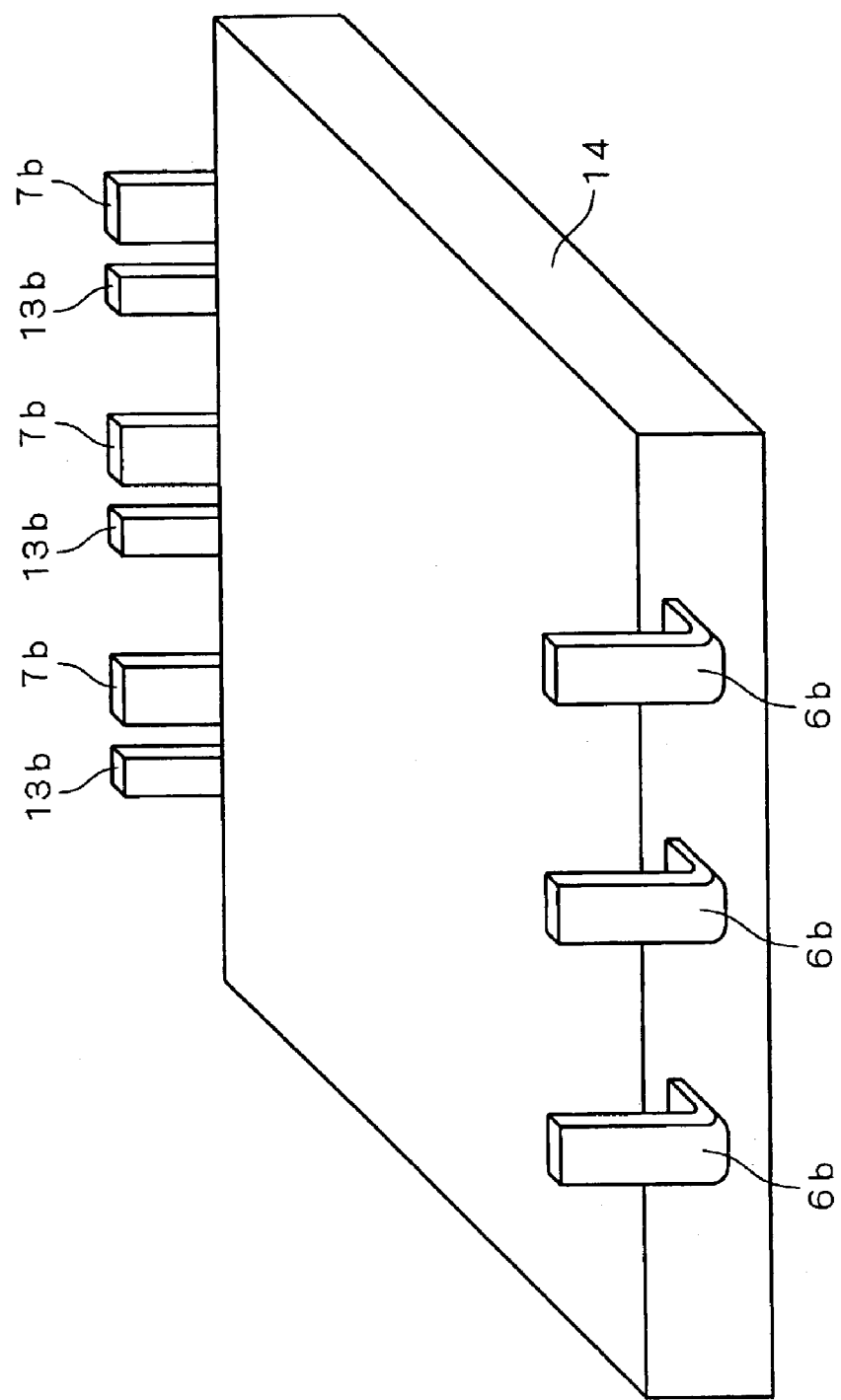

F I G . 1 3
< BACKGROUND ART >
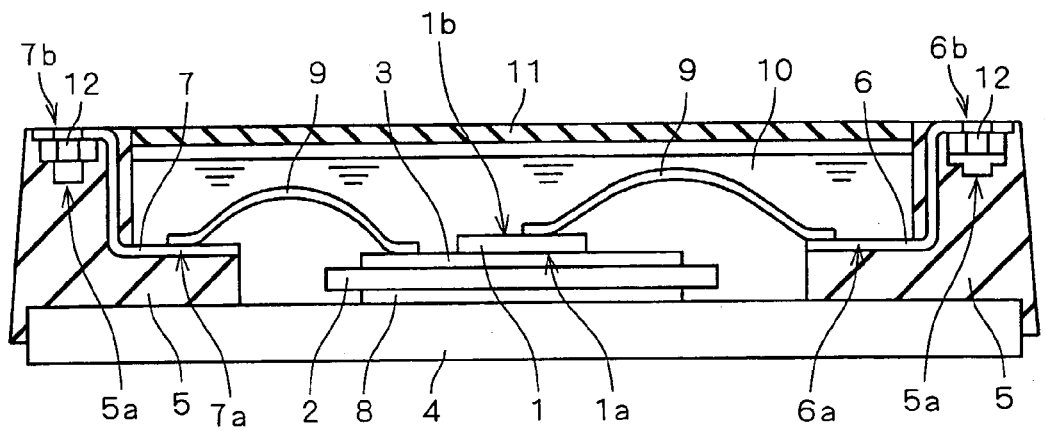
F I G . 1 4
< BACKGROUND ART >
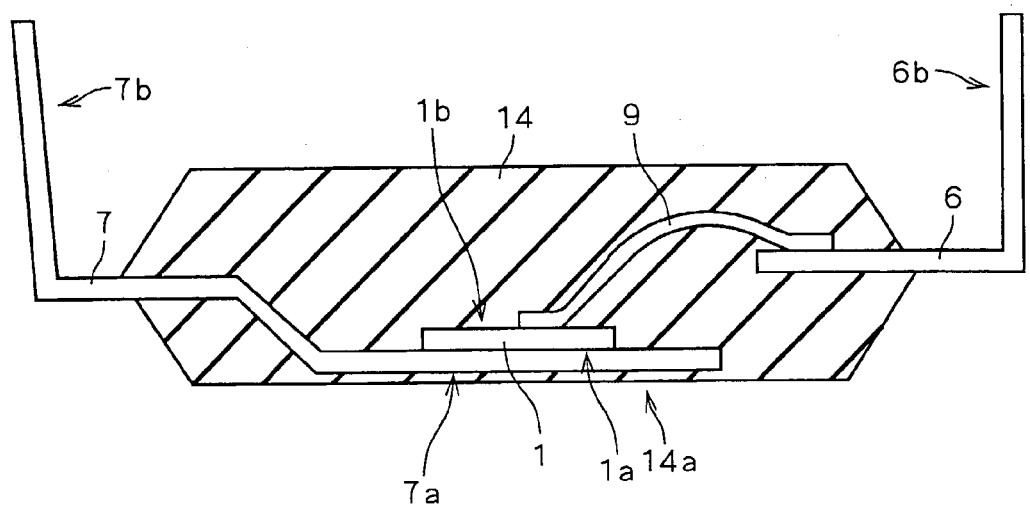

<BACKGROUND ART>

POWER SEMICONDUCTOR DEVICE

BACKGROUND OF THE INVENTION

1. Field of the Invention

The present invention relates to power semiconductor devices such as inverters.

2. Description of the Background Art

FIG. 13 shows a conventional power semiconductor device. In this power semiconductor device, an electrode 1a disposed on the bottom surface of a semiconductor device 1, such as a diode, is fixed by soldering on a wiring pattern 3 in the top surface of a ceramic substrate 2. The ceramic substrate 2 is fixed by solder 8 on a base plate 4 composed of for example oxygen free high conductivity copper.

A casing 5 is screwed on or adhered to the base plate 4. The casing 5 is formed by for example PPS (polyphenyl sulfide). Lead frames 6, 7 and a nut 12 are integrated in the casing 5. One ends of the lead frames 6 and 7 function as internal electrodes 6a and 7a, and the other ends function as external electrodes 6b and 7b, respectively. The nut 12 is disposed for connecting external wiring (not shown) to the external electrodes 6b and 7b. The use of a bolt (not shown) that connects by fastening pressure the external wiring to the external electrodes 6b and 7b reduces contact resistance therebetween.

The internal electrode 6a is connected via an aluminum wire 9 to an electrode 1b disposed in the top surface of the semiconductor device 1, and the wiring pattern 3 on the ceramic substrate 2 is connected via other aluminum wire 9 to the internal electrode 7a. For example, the aluminum wires 9 have a diameter of approximately a few hundreds $\mu$m.

The internal space surrounded by the casing 5 and base plate 4 is filled with a silicone gel 10 to ensure insulating characteristic. A cover 11 to protect the silicone gel 10 against external air is disposed so as to cover the surface of the casing 5.

In the power semiconductor device shown in FIG. 13, the aluminum wires 9 are used as wiring. In order to reduce the resistance loss when current flows through the aluminum wires 9, it is necessary to increase the cross section area of the aluminum wires 9 (i.e., to increase the wire diameter), alternatively, to increase the number of wires. Joining the aluminum wires 9 to each electrode requires a joint area that has a width of at least not less than twice the diameter of the aluminum wires 9 and a length of at least not less than third times the diameter. If desired to reduce the area of the semiconductor device 1 by increasing the amount of current per unit area of the semiconductor device 1, it is necessary to ensure a wide joint area, which obstructs downsizing of the semiconductor device 1.

In addition, there is the problem that the joint interface between the top surface of the semiconductor device 1 and the electrode 1b is subject to separation due to temperature cycle (heat cycle). When the semiconductor device 1 is made of silicon, its coefficient of linear expansion is approximately $2.3 \times 10^{-6}$ [/K]. On the other hand, the coefficient of linear expansion of aluminum is approximately $23 \times 10^{-6}$ [/K]. Due to this difference in the coefficient of linear expansion, thermal stress is caused by the exothermic during the use of the power semiconductor device, and the thermal stress induces separation on the joint interface. This thermal stress occurs cyclically when the load on the power semiconductor device is increased and decreased or the power is turned on and off.

For instance, if there is a temperature difference of 50° C., the aluminum wires 9 suffer from separation in a temperature cycle of millions of times. It is therefore necessary to avoid that the temperature of the semiconductor device 1 varies greatly depending on load circumstances in the power semiconductor device.

When plural wires are used for a single joint, current is fed in an island shape from the joint area of each wire to the electrodes, which causes the following problem. That is, the portions of the electrode located in the vicinity of the wire joint areas are low in resistance, whereas to the portions apart from the wire joint areas, resistance component is added to increase resistance loss. A large resistance loss on the electrodes in the surface of the semiconductor device 1 has presented difficulties in obtaining satisfactory device characteristics.

Consequently, if desired to increase the current density of the semiconductor device 1, it is necessary to take the following measures: (i) increasing the size of the semiconductor device to decrease its exothermic density; or (ii) connecting the semiconductor devices in parallel to decrease the exothermic density per device. With these measures, however, the entire size of the power semiconductor device is increased thereby to increase its manufacturing cost.

It also takes from one to a few seconds to joint a single aluminum wire 9. Accordingly, it takes a great deal of time to manufacture a high power module requiring millions of wires, which also increases its manufacturing cost.

FIG. 14 shows other conventional power semiconductor device different from that in FIG. 13. In this power semiconductor device, an electrode 1a disposed on the bottom surface of a semiconductor device 1 is fixed by soldering on one end 7a of a lead frame 7 that is made of copper alloy. The other end 7b of the lead frame 7 functions as an external electrode. An electrode 1b disposed on the top surface of the semiconductor device 1 is connected to one end of a lead frame 6 via an aluminum wire 9. The other end 6b of the lead frame 6 functions as an external electrode.

The semiconductor device 1, aluminum wire 9, and parts of lead frames 6 and 7 are integrally covered by means of transfer molding using a mold resin 14.

The use of transfer moldering facilitates the manufacturing steps of the power semiconductor device of FIG. 14. However, the use of the aluminum wire 9 causes the same problem as in the power semiconductor device of FIG. 13.

FIG. 15 shows still other conventional power semiconductor device. In this power semiconductor device, as in the instance of FIG. 13, an electrode 1a disposed on the bottom surface of a semiconductor device 1 is fixed by soldering on a wiring pattern 3 in the top surface of a ceramic substrate 2. The ceramic substrate 2 is fixed by solder 8 on a base plate 4. A casing 5 is screwed on or adhered to the base plate 4.

The power semiconductor device of FIG. 15 uses no aluminum wire 9. Instead of that, lead frames 6 and 7 made of copper and integrally formed in the casing 5 extend to the vicinity of the semiconductor device 1 and wiring pattern 3, respectively. An internal electrode 6a of the lead frame 6 is connected to an electrode 1b on the surface of the semiconductor device 1, and an internal electrode 7a of the lead frame 7 is connected to the wiring pattern 3. The internal electrodes 6a and 7a are connected via a conductive adhesive to the electrode 1b and wiring pattern 3, respectively.

The use of the lead frames 6 and 7 in place of aluminum wire avoids increasing the entire size of the power semiconductor device and its manufacturing cost that have been problems involved in using aluminum wire.

However, another problem remains in the power semiconductor device of FIG. 15. The problem is differences in the coefficient of linear expansion between the semiconductor device 1 and lead frame 6. When the semiconductor device 1 is made of silicon, its coefficient of linear expansion is approximately $2.3 \times 10^{-6}$ [/K]. On the other hand, the coefficient of linear expansion of copper that is the material of the lead frame 6 is approximately $16.7 \times 10^{-6}$ [/K]. Due to this difference, thermal stress is caused by the exothermic during the use of the power semiconductor device. Due to this thermal stress, the connection part of the lead frame 6 is subject to fatigue failure. In other words, there occurs separation of the conductive adhesive. Even if soldering is employed in place of the conductive adhesive, the problem of fatigue failure still remains.

SUMMARY OF THE INVENTION

It is an object of the present invention to provide a power semiconductor device that uses a lead frame for making connection to a semiconductor device and has a structure less subject to fatigue failure at the connection part of the lead frame.

According to the present invention, a power semiconductor device includes: a semiconductor device having a top surface and a bottom surface; a metal block fixed on the bottom surface of the semiconductor device; a lead frame fixed on the top surface of the semiconductor device; and a casing of mold resin integrally covering the semiconductor device, metal block, and lead frame.

The casing of the mold resin integrally covers the lead frame, metal block and semiconductor device. The mold resin surrounding the lead frame and semiconductor device strengthens the joint therebetween, thus permitting a power semiconductor device having a structure less subject to fatigue failure at the joint part of the lead frame. The metal block fixed on the bottom surface of the semiconductor device can be used as a substrate mounting the semiconductor device. When an electrode is disposed on the bottom surface of the semiconductor device, the metal block can be used as a joint part to the electrode. The metal block can also be used as a heat spreader to diffuse the exothermic of the semiconductor device. The mold resin surrounding the metal block and semiconductor device strengthens the joint therebetween.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a perspective view after covering the power semiconductor device of the eighth preferred embodiment with the mold resin; and FIGS. 13 to 15 are sectional views showing conventional power semiconductor devices.

DESCRIPTION OF THE PREFERRED EMBODIMENTS

First Preferred Embodiment

A first preferred embodiment is directed to a power semiconductor device in which lead frames, a semiconductor device, and a metal block serving as a substrate mounting the semiconductor device are integrally covered by a mold resin of a casing. The mold resin surrounding the lead frames and semiconductor device strengthens the joint therebetween, thereby obtaining the power semiconductor device less subject to fatigue failure at the connection part of the lead frames.

Figure 1:
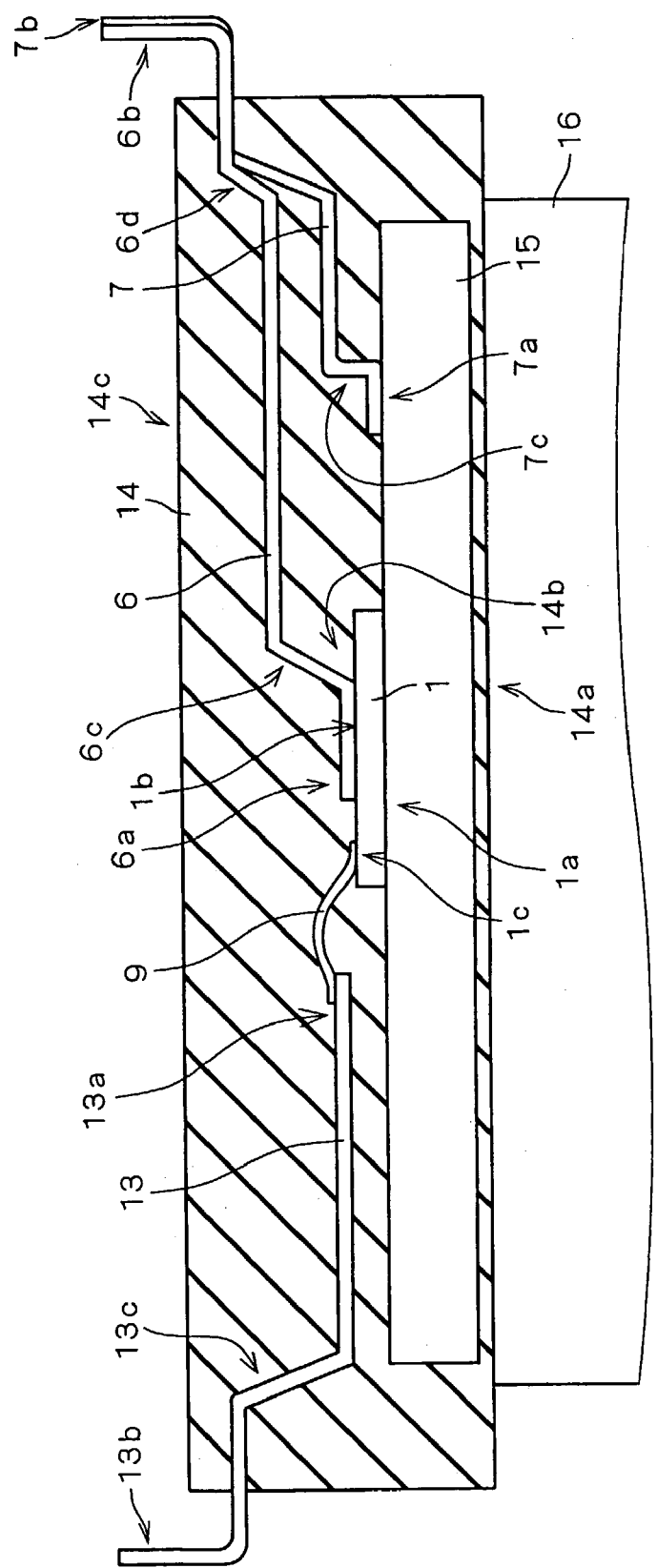
FIG. 1 is a sectional view showing a power semiconductor device according to a first preferred embodiment of the invention.
Figure 2:
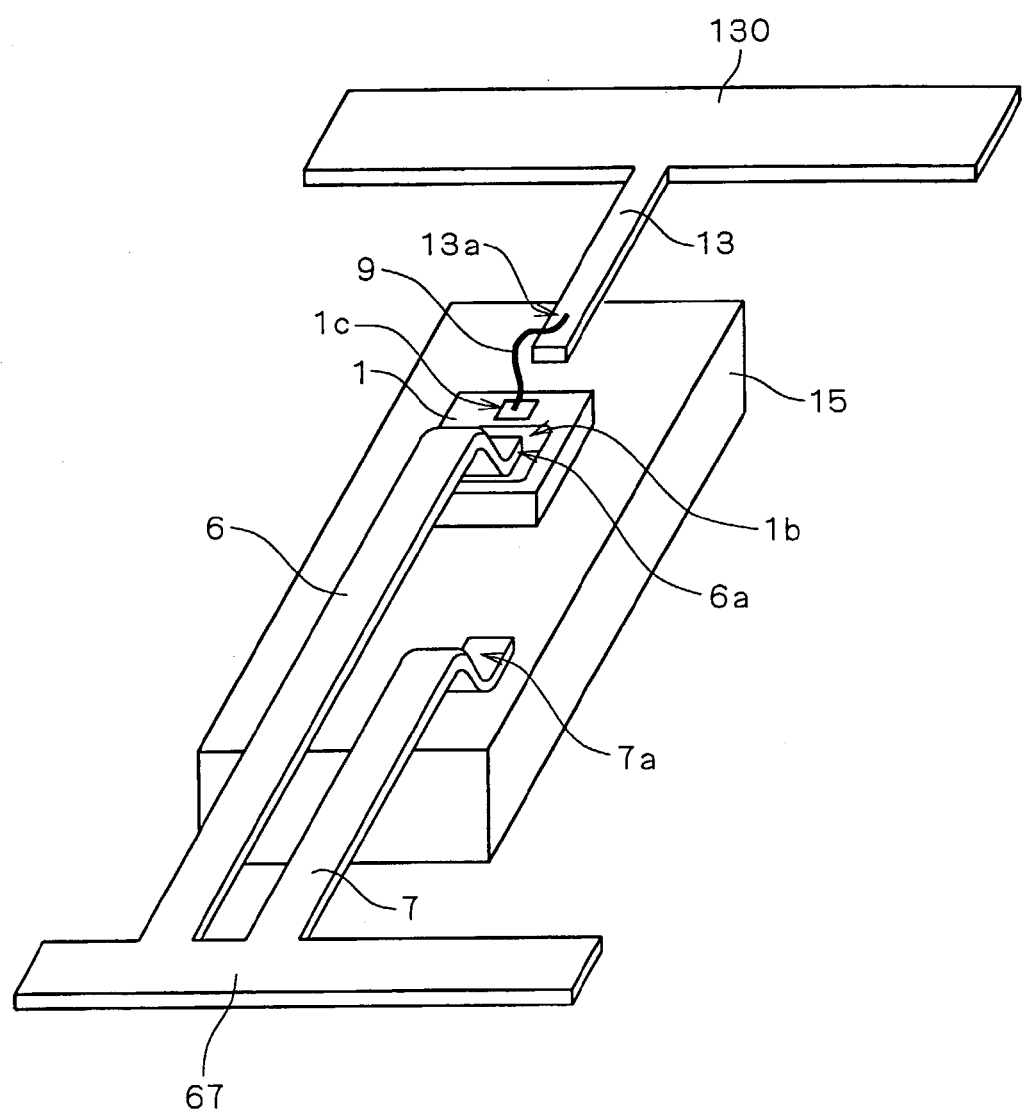
FIG. 2 is a perspective view before covering the power semiconductor device of the first preferred embodiment with a mold resin.
Figure 3:
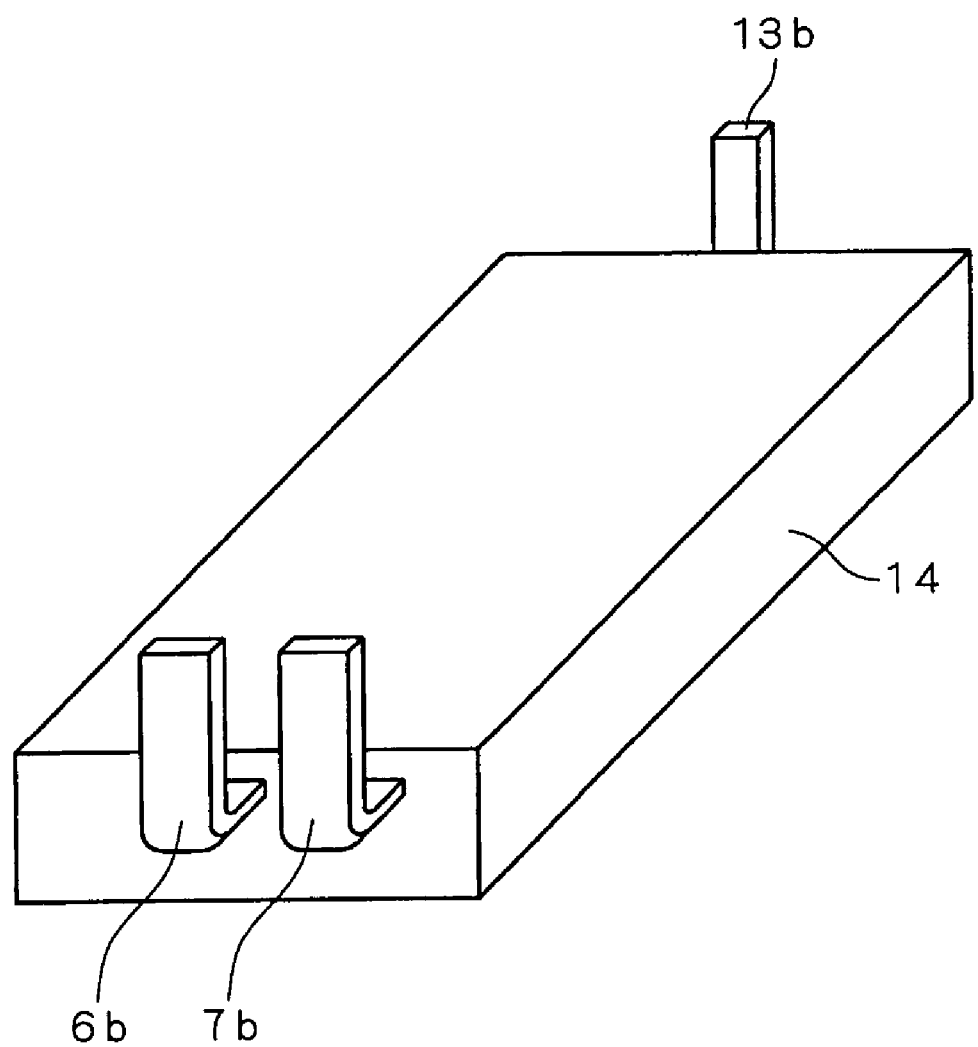
FIG. 3 is a perspective view after covering the power semiconductor device of the first preferred embodiment with the mold resin.

FIG. 1 shows the power semiconductor device according to the first preferred embodiment. FIG. 2 is a perspective view before covering with the mold resin. FIG. 3 is a perspective view after covering with the mold resin.

In this power semiconductor device, a main electrode 1a (e.g., an anode electrode) disposed on the bottom surface of the semiconductor device 1, such as a thyristor, is fixed on a metal block 15 that is for example made of oxygen free high conductivity copper by soldering (this and the following other soldering are not shown). A lead frame 7 is fixed at its end part 7a on the metal block 15 by for example soldering. The other end part 7b of the lead frame 7 functions as an external electrode of the main electrode 1a.

A lead frame 6 is fixed at its end part 6a on a main electrode 1b (e.g., a cathode electrode) disposed on the surface of the semiconductor device 1 by soldering. The other end part 6b of the lead frame 6 functions as an external electrode of the main electrode 1b.

One end of the aluminum wire 9 is fixed on a signal electrode 1c (e.g., a gate electrode) disposed on the surface of the semiconductor device 1 by soldering. The other end of the aluminum wire 9 is fixed on an end part 13a of a lead frame 13 by soldering. The other end part 13b of the lead frame 13 functions as an external electrode of the signal electrode 1c.

Although soldering is used as a method of fixing the electrodes in this preferred embodiment, other technique such as welding can be used.

The mold resin of the casing 14 is used for integrally covering the semiconductor device 1, metal block 15, aluminum wire 9, and lead frames 6, 7, 13. The mold resin of the casing 14 also extends on a side of the metal block 15 opposite the semiconductor device 1, thereby forming a surface 14a. A heat sink 16 to diffuse the exothermic of the semiconductor device 1 is joined to the surface 14a.

In this preferred embodiment, instead of aluminum wire, the lead frames 6 and 7 are used for connecting to the main electrodes 1a and 1b of the semiconductor device 1. It is therefore possible to avoid increasing the entire size of the power semiconductor device and its manufacturing cost that have been problems involved in using aluminum wire. Note that the aluminum wire 9 may be used for connecting the signal electrode 1c. Since the amount of current flowing therethrough is minute, the temperature rise is slight and the possibility of separation is remote. Although FIG. 1 shows the instance that the aluminum wire 9 is used for connecting the signal electrode 1c, in place of the aluminum wire 9, the lead frame 13 may be fixed on the signal electrode 1c.

Further in this preferred embodiment, the lead frames 6, 7, 13, metal block 15, and semiconductor device 1 are integrally covered with the mold resin of the casing 14. The mold resin surrounding the lead frame 6 and semiconductor device 1 can strengthen the joint therebetween and permits the power semiconductor device less subject to fatigue failure at the connection part of the lead frame 6.

In addition, the metal block 15 fixed on the bottom surface of the semiconductor device 1 can serve as a substrate mounting the semiconductor device 1. When the main electrode 1a is disposed on the bottom surface of the semiconductor device 1, the metal block 15 can serve as a connection part to the main electrode 1a. The metal block 15 can also serve as a heat spreader to diffuse the exothermic of the semiconductor device 1. The mold resin surrounding the metal block 15 and semiconductor device 1 strengthens the joint therebetween.

It is desirable that the end part 6a of the lead frame 6, serving as a fixing area to the main electrode 1b, has such a shape as to be nested in the surface of the semiconductor device 1, without making contact with the peripheral part of the semiconductor device 1. This is because the necessary insulating property might not be ensured owing to the contact with the peripheral part of the semiconductor device 1. By nesting the end part 6a in the surface of the semiconductor device 1, the joint area between the lead frame 6 and main electrode 1b can be made smaller than when the most part of the surface of the semiconductor device 1 is connected to the end part 6a. As the result, the end part 6a is less subject to fatigue failure due to temperature cycle.

In this preferred embodiment, the frame 6 has a step 6c for obtaining such a shape as to nest the end part 6a in the surface of the semiconductor device 1. By the presence of the step 6c, the mold resin can easily enter a position 14b between the frame 6 and semiconductor device 1, thereby obtaining the effect of suppressing an occurrence of void within the casing 14.

Referring to FIG. 1, the lead frame 6 is of constant thickness in the first preferred embodiment. However, it is not essential to make the thickness of the lead frame 6 constant.

In particular, the end part 6a, which serves as a fixing plane to the main electrode 1b, preferably has a thickness not more than about twice the thickness of the semiconductor device 1. By reducing the thickness of the end part 6a to that degree, the thermal stress on the lead frame 6 can be reduced so that the lead frame 6 is less subject to fatigue failure due to temperature cycle.

Therefore, the thickness may vary over different portions of the lead frame 6 to an extent that there occurs no problem of electrical resistance value.

The casing 14 is formed as follows. Referring to FIG. 2, after the semiconductor device 1 is fixed on the metal block 15, a prior-to-cutaway part 67 of the lead frames 6 and 7, and a prior-to-cutaway part 130 of the lead frame 13 are subjected to bending for connection to the respective electrodes. Then, a transfer molding is performed while fixing the prior-to-cutaway parts 67 and 130. Thereafter, the prior-to-cutaway parts 67 and 130 are cut at their predetermined portions, followed by bending. This results in the state shown in FIG. 3.

Figure 15:
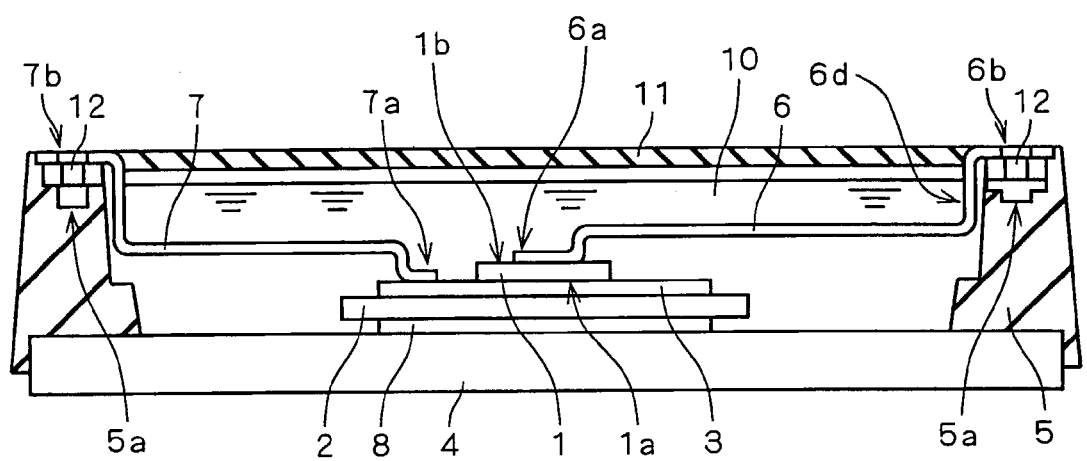

Preferably, the mold resin is of such a material that is mainly composed of epoxy resin and has a strong adhesive. When the surroundings of the semiconductor device 1 are covered with a low Young's modulus material such as silicone gel, as shown in FIGS. 13 and 15, strain is likely to occur due to the difference in the coefficient of thermal expansion among the semiconductor device 1, ceramic substrate 2, and lead frame 6. Such strain is likely to cause cracks.

On the other hand, as in the first preferred embodiment, the mold resin surrounding the semiconductor device 1, the metal block 15, and lead frame 6 enables to suppress an occurrence of strain due to the difference in the coefficient of thermal expansion, thereby strengthening the joint therebetween. Using a strong adhesive material further increases this effect.

The mold resin is preferably such a material having a coefficient of linear expansion in the range of ±20% different from that of the metal block 15.

When the coefficient of linear expansion of the mold resin is considerably lower than that of the metal block 15, after covering with the mold resin, the metal block 15 tends to shrink more greatly than the mold resin in the step of cooling. As the result, a joint gap might occur in the interface between the mold resin and metal block 15.

On the other hand, when the coefficient of linear expansion of the mold resin is considerably higher than that of the metal block 15, a joint gap might occur in the interface between the mold resin and metal block 15 by the exothermic of the semiconductor device 1 during the use of the power semiconductor device.

Under these circumstances, it is desirable that the mold resin and metal block 15 have a similar coefficient of linear expansion.

The power semiconductor device is less subject to warp when the coefficient of linear expansion of the metal block 15 underlying the semiconductor device 1 is similar to that of the mold resin overlying the semiconductor device 1. As the result, it is possible to prevent cracks from occurring between the semiconductor device 1 and lead frame 6.

Although in the first preferred embodiment, oxygen free high conductivity copper is used as the material of the metal block 15, there may be used any metal having a coefficient of linear expansion similar to that of Si, such as Mo, CuMo alloy, and SiC—Al. Using such metal for the metal block 15 further suppresses heat cycle fatigue of the solder between the semiconductor device 1 and metal block 15. Also in this instance, it is necessary to adjust the coefficient of linear expansion of the mold resin by for example increasing the amount of filler.

The above-mentioned construction enables to remarkably suppress heat cycle fatigue failure of the solder that is caused by the differences in the coefficient of linear expansion among the semiconductor device 1, metal block 15, and lead frame 6.

The first preferred embodiment shows an example that the mold resin is thicker than the metal block 15, as shown in FIG. 1. The mold resin has the characteristic that it shrinks in accordance with the curing upon molding, whereas the metal block 15 does not shrink. Therefore, the power semiconductor device is subject to warp. An occurrence of warp easily lowers the adhesion of the heat sink 16 and therefore impairs radiation. Hence, it is desirable that the mold resin has a small thickness.

In the first preferred embodiment, the mold resin extends to the surface 14a on the bottom surface of the metal block 15. The bottom surface of the metal block 15 may be exposed from the casing 14. In this instance, after transfer molding, an insulating layer such as a ceramic substrate or silicone sheet may be attached to the exposed surface of the metal block 15. Alternatively, when fixing the casing 14 to the heat sink 16, an insulating layer such as a ceramic substrate or silicone sheet may be interposed between the heat sink 16 and the exposed surface of the metal block 15.

When using a ceramic substrate, its thermal conductivity to the mold resin is high and thus thermal resistance is lowered. On the other hand, using a silicone sheet lowers the cost of manufacture. Handling facility of the power semiconductor device can be improved by ensuring the insulation between the metal block 15 and heat sink 16, as described above.

The heat sink 16 is cramped by using a jig. The exothermic of the semiconductor device 1 is transferred to the metal block 15, insulating layer, and the heat sink 16, and then dissipated. When the thermal resistance between the insulating layer and the heat sink 16 is high, a thermal conducting grease may be applied therebetween.

Although FIG. 2 shows the instance that after the semiconductor device 1 is mounted on the metal block 15, the lead frames 6, 7, 13 are fixed on the semiconductor device 1, any other manufacturing process may be used. For example, an alternative process comprises the steps of: (i) positioning the semiconductor device 1 so as to oppose to the lead frames 6 and 7; (ii) joining the lead frames 6 and 7 to the semiconductor device 1; (iii) joining the lead frame 13 by the aluminum wire 9; (iv) joining the metal block 15 to the bottom surface of the semiconductor device 1; (v) joining the respective lead frames to the metal block 15 by for example resistance welding; and (vi) disposing an integral structure of the lead frames 6, 7, 13, semiconductor device 1, and metal block 15 in a metal mold for transfer molding, followed by integral formation by means of transfer molding.

With this process, the metal block 15 of heavy weight can be fixed on the semiconductor device 1 immediately before integration by the step of transfer molding. This elongates a period of time of conveying while supporting the lead frames, thus permitting a light and easy conveyance. There is no need to use any special manufacturing equipment. For instance, when the lead frame width is approximately not more than 70 mm, it is unnecessary to make any large changes in the manufacturing equipment such as a die bonder and wire bonder. Thereby, the manufacturing equipment is of low cost and it is easy to attain a mix line with other different type devices, thereby increasing productivity. This realizes a low-cost product.

Second Preferred Embodiment

A second preferred embodiment is a modification of the power semiconductor device in the first preferred embodiment. Specifically, external electrodes 6b, 7b, 13b of lead frames 6, 7, 13 are disposed at locations projecting from a main surface of a casing 14 in a direction normal to and away from a plane of a metal block 15 on which a semiconductor device 1 is fixed. This construction permits a reduction in the thickness of the casing 14, thereby reducing the size of power semiconductor device.

Figure 4:
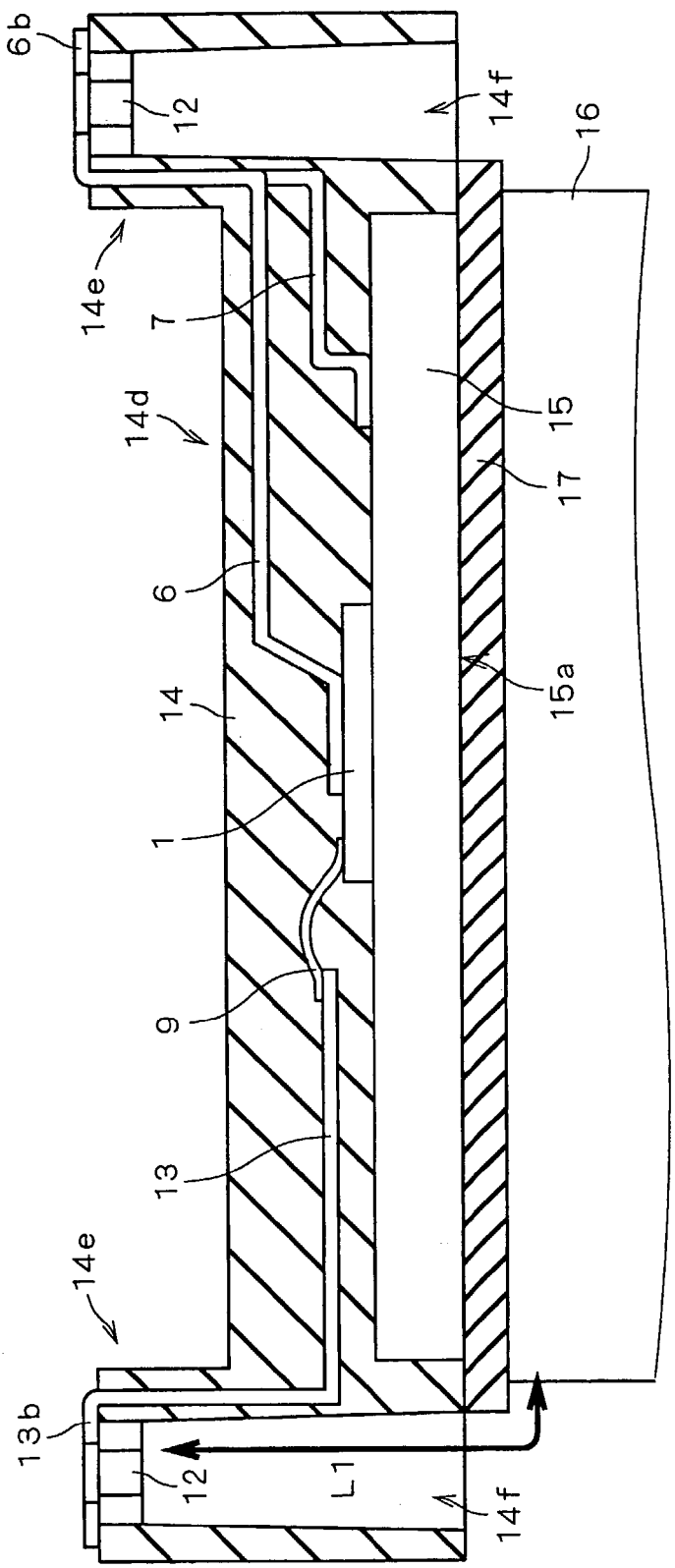
FIG. 4 is a sectional view showing a power semiconductor device according to a second preferred embodiment of the invention.

FIG. 4 shows a power semiconductor device according to the second preferred embodiment. In this power semiconductor device, parts of the lead frames 6, 7, 13 which are exposed from the casing 14 as the external electrodes 6b, 7b, 13b are disposed on a casing projection part 14e that projects from a main surface 14d of the casing 14 in a direction normal to and away (upwardly as viewed in FIG. 4) from a fixing area of the semiconductor device 1 in the top surface of the metal block 15. The interior of the casing projection part 14e is void 14f. Nuts 12 are respectively disposed at portions of the void 14f that are in contact with the external electrodes 6b, 7b, and 13b. The nuts 12 are provided for connecting the external electrodes 6b, 7b and 13b to external wirings (not shown). By using bolts (not shown) that connects by fastening pressure the external wirings to the external electrodes 6b, 7b, 13b, the contact resistance therebetween can be reduced.

Thus, by disposing the external electrodes 6b, 7b, and 13b on the casing projection part 14e, the main surface 14d of the casing 14 should be positioned at a height enough to cover the lead frames 6, 7, and 13. This allows for a reduction in the thickness of the casing 14 and thus a reduction in the size of power semiconductor device. In addition, the external electrodes 6b, 7b, and 13b are disposed at the location projecting in a direction normal to and away from the fixing area of the semiconductor device 1 on the metal block 15. Therefore, even if a heat sink 16 is provided on a side of the surface of the casing 14 on which the metal block 15 is disposed, it is possible to increase insulating distance L1 between the heat sink 16 and external electrodes 6b, 7b, 13b, thereby increasing the reliability of power semiconductor device.

In the second preferred embodiment, unlike the first preferred embodiment, the mold resin of the casing 14 does not extend on a bottom surface 15a, on the side of the metal block 15 opposite the semiconductor device 1. Instead of this, the bottom surface 15a of the metal block 15 is exposed from the casing 14. To cover the exposed part, an insulating layer 17 that is for example made of alumina is fixed on the metal block 15 and casing 14 by using a conductive adhesive. The heat sink 16 is crimped onto the insulating layer 17. Otherwise, the configuration is the same as that of the power semiconductor device in the first preferred embodiment, and its description is therefore omitted.

In accordance with the second preferred embodiment, a reduction in the thickness of the casing 14 permits a reduction in the amount of mold resin necessary for the manufacture, thereby effecting a reduction in the cost of manufacture. When the contribution of the casing 14 is compared with the contribution of the metal block 15 to the rigidity of the entire power semiconductor device, the ratio of the latter is relatively increased by the amount of reduction in the thickness of the casing 14. Since the rigidity of the metal block 15 is usually higher than that of the mold resin, a further reduction in the warp of the power semiconductor device is attainable by the above-mentioned configuration. As previously described, the warp is caused by a difference in coefficient of linear expansion between the metal block 15 and mold resin, as well as curing shrinkage of the mold resin.

Reducing the warp of the power semiconductor device produces the following effect. When a material of high rigidity such as alumina is used for insulating layer 17, the stress on the insulating layer 17 and conductive adhesive can be reduced thereby to increase the reliability of the power semiconductor device that is subject to severe temperature conditions. When fixing is performed by using solder instead of the conductive adhesive, a certain thickness of solder is necessary for burying a joint gap between the insulating layer 17 and metal block 15. However, less warp of the bottom surface 15a of metal block 15 affords the advantage that at least sufficient thickness of solder can be reduced and thus permits a low thermal resistance.

Further, there is the advantage that when the heat sink 16 is attached to the insulating layer 17, less warp of the surface of the insulating layer 17 reduces the thermal resistance between the heat sink 16 and insulating layer 17.

In the instance of the first preferred embodiment, it is necessary to increase the thickness of the power semiconductor device in order to increase the insulating distance between the heat sink 16 and external electrodes projecting from the side surfaces. However, the mold resin should be of large enough thickness to encase the lead frames 6, 7, 13 and aluminum wire 9 within the casing 14.

In the conventional wire bonding structure as shown in FIG. 13, for example, plural aluminum wires having a diameter of 400 μm make electrical wirings. To protect the aluminum wires, it is necessary to form an arch shape having a height of about a few mm by using aluminum wiring. To protect the aluminum wires, it is necessary to increase the thickness of the casing.

Whereas the second preferred embodiment employs the lead frames instead of aluminum wires, and there is no need to wastely increase the thickness of mold resin in order to cover arches of wire bonding. Also in the second preferred embodiment, the aluminum wire 9 is used for wiring to the signal electrode 1c. This is because the amount of current flowing therethrough is slight and therefore a short and narrow wire is sufficient. Accordingly, the height of the arches falls within about a few hundreds μm, which does not noticeably affect the mold resin thickness.

Third Preferred Embodiment

A third preferred embodiment is a modification of the power semiconductor device in the second preferred embodiment. Specifically, external electrodes are disposed at a point inwardly from the side end part of a casing in a main surface of the casing. This further increases the insulating distance between a heat sink and the external electrodes.

Figure 5:
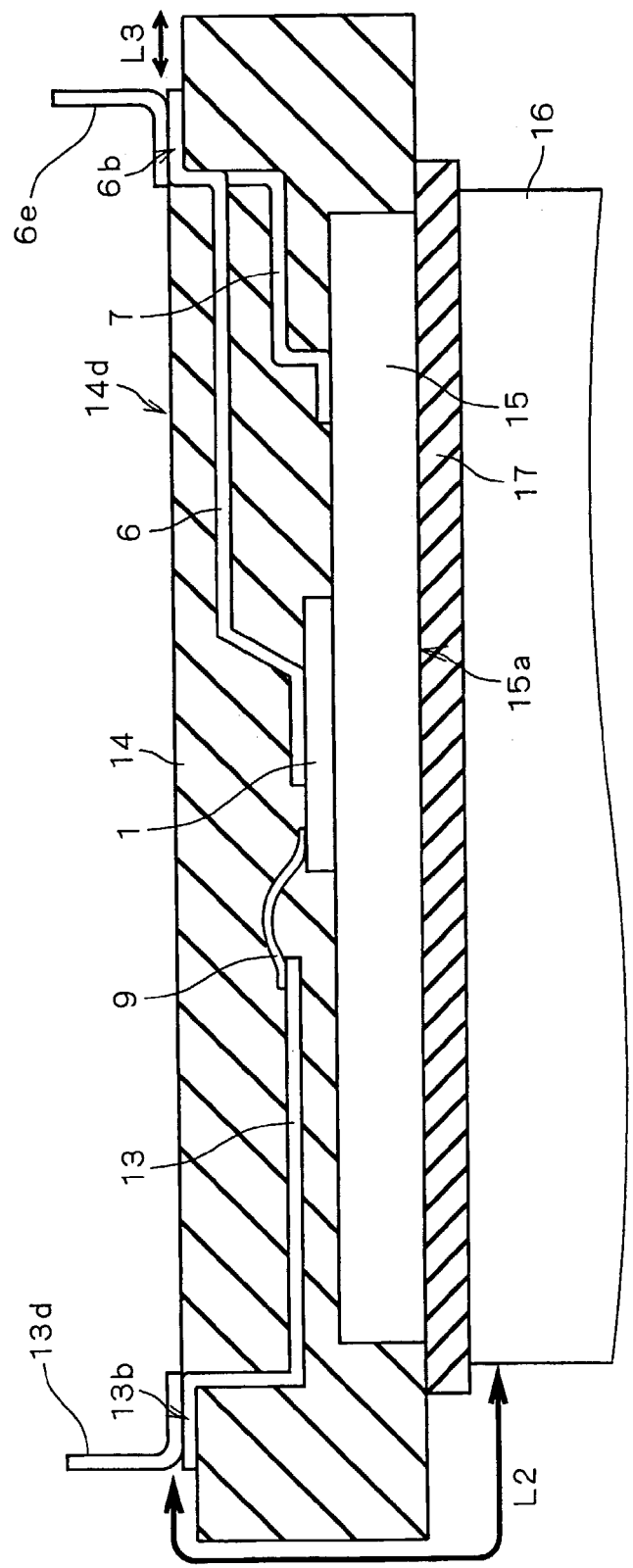
FIG. 5 is a sectional view showing a power semiconductor device according to a third preferred embodiment of the invention.

FIG. 5 shows a power semiconductor device according to the third preferred embodiment. In this device, conductors 6e and 13d are also fixed by soldering on parts of lead frames 6, 7 and 13 that are exposed from the casing 14 as external electrodes 6b, 7b, and 13b, respectively. The resultants are referred to as external electrodes. The conductor is also fixed on the external electrode 7b by soldering. This is not shown in FIG. 5 because it is located at the back of the conductor 6e.

In the third preferred embodiment, the casing 14 has no casing projection part 14e. Instead of that, the conductors 6e and 13d are joined to the external electrodes. As the result, the external electrodes are disposed at locations projecting from the main surface of the casing 14 in a direction normal to and away from a side of a metal block 15 on which a semiconductor device 1 is fixed. Otherwise, the configuration is the same as that of the power semiconductor device in the second preferred embodiment, and its description is therefore omitted.

Thus, the third preferred embodiment has the feature that the external electrodes 6b, 6e, 7b, 13b, and 13d are located at a point inwardly distance L3 from the side end part of the casing 14 in the main surface 14d of the casing 14. This further increases the insulating distance L2 between the heat sink 16 and the external electrodes, thereby further increasing the reliability of the power semiconductor device.

Fourth Preferred Embodiment

A fourth preferred embodiment is also a modification of the power semiconductor device in the second preferred embodiment. Specifically, projections are provided on a plane of a metal block 15 on which a semiconductor device 1 is fixed. This contributes to improvements in adhesion at the interface between a mold resin and the metal block 15.

Figure 6:
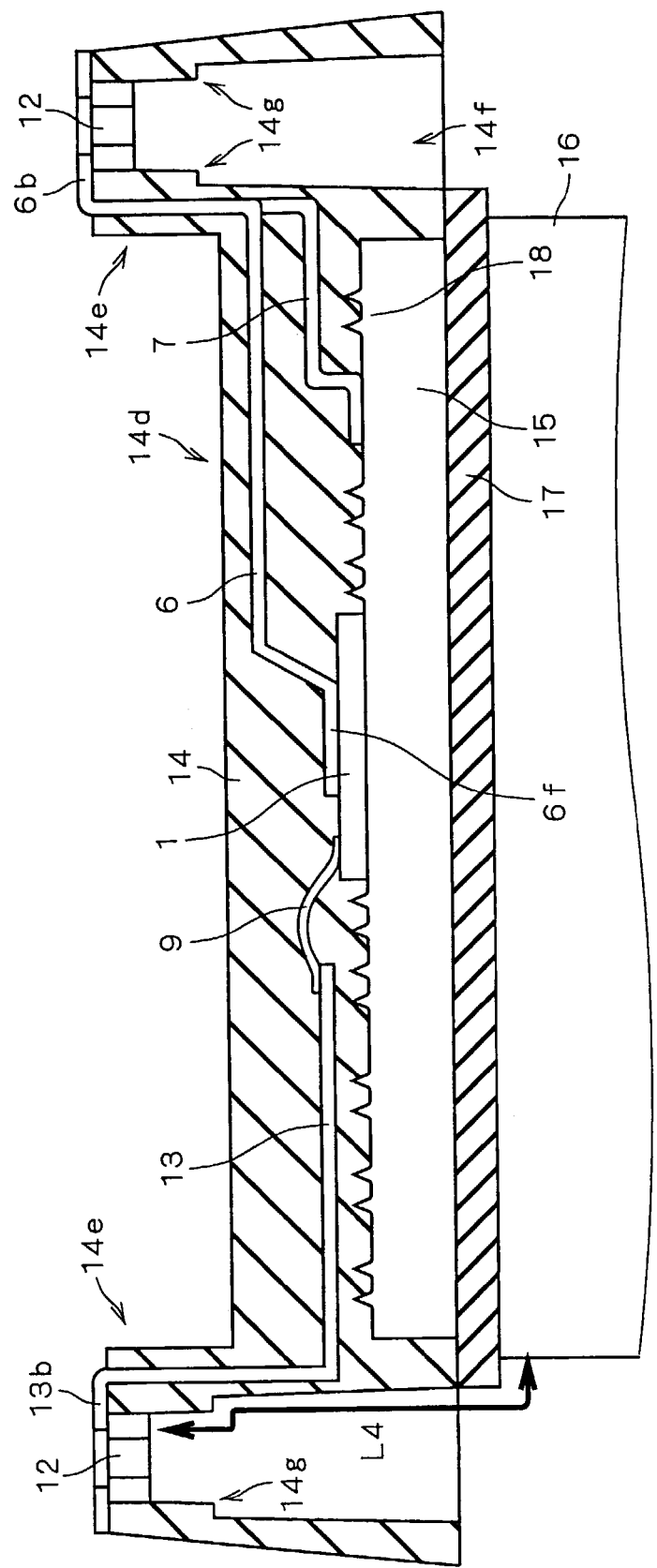
FIG. 6 is a sectional view showing a power semiconductor device according to a fourth preferred embodiment of the invention.
Figure 7:
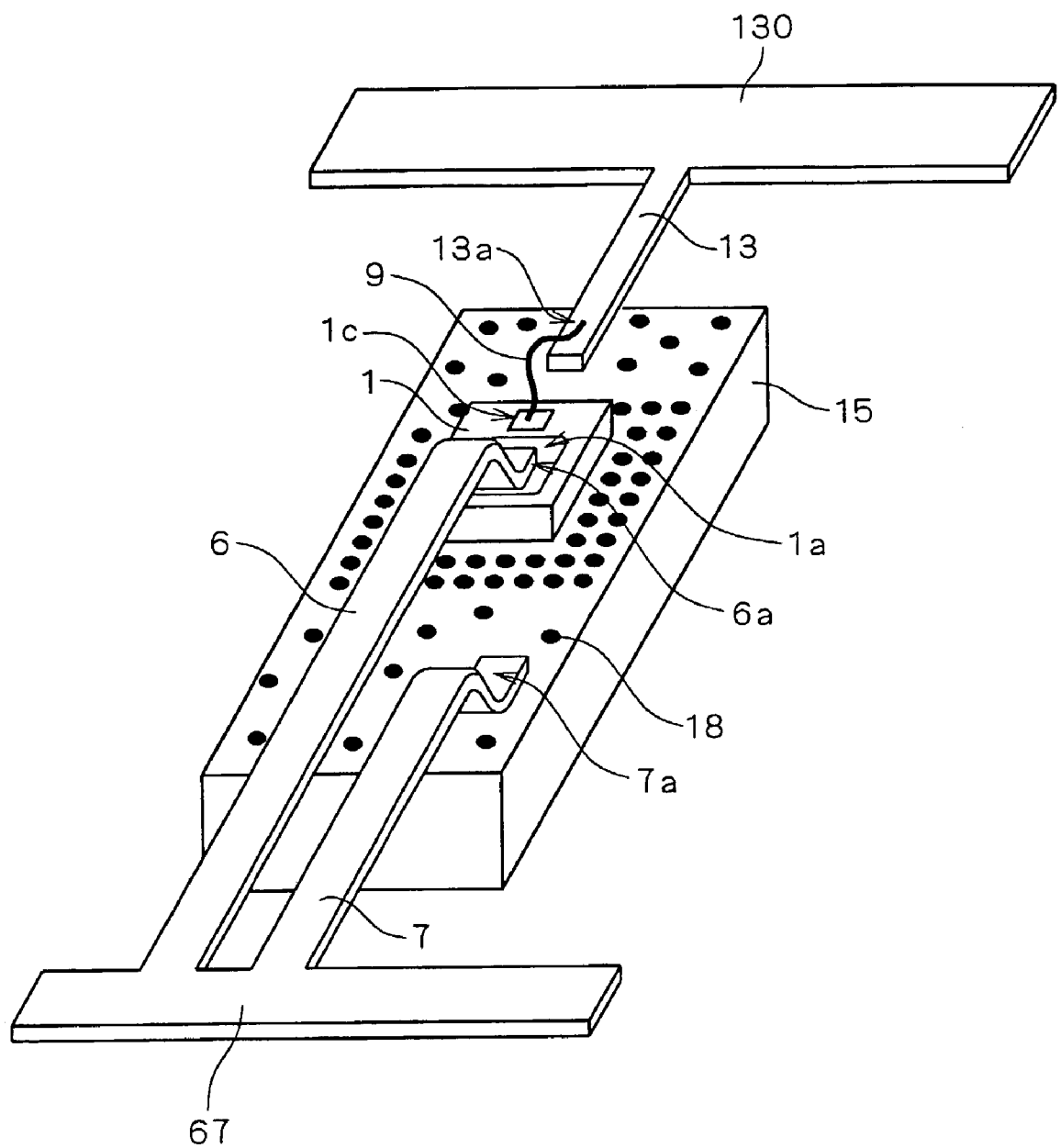
FIG. 7 is a perspective view before covering the power semiconductor device of the fourth preferred embodiment with a mold resin.

FIG. 6 shows a power semiconductor device according to the fourth preferred embodiment. FIG. 7 is a perspective view before covering with the mold resin. Referring to these figures, the fourth preferred embodiment has the feature that plural projections 18 are spaced apart on the plane of metal block 15 on which the semiconductor device 1 is fixed. The projections 18 produce anchor effect for strengthening adhesive strength between the metal block 15 and mold resin, thereby increasing the reliability of the power semiconductor device.

It is particularly effective that the projections 18 are disposed collectively at the end part of the metal block 15 and around the semiconductor device 1 on the plane of metal block 15 on which the semiconductor device 1 is fixed. Of course, projections 18 may be disposed therebetween, preferably at high density.

In the power semiconductor device of the second preferred embodiment, the following phenomenon might occur when a temperature difference in temperature cycle conditions is set to a large value in consideration of severe environment. That is, between the mold resin and metal block 15, separation occurs and reaches the surroundings of the semiconductor device 1, and crack occurs in the solder of a die bonding part of the semiconductor device 1. This shows that the reliability of power semiconductor device is greatly influenced by the mold resin. A power semiconductor device that is satisfactory for use under severe environment can be realized by increasing adhesive between the mold resin and metal block 15, as in the fourth preferred embodiment.

To suppress an occurrence of crack itself, it is effective to locate the projections 18 in the vicinity of the end part of the metal block 15. To prevent crack growth to the solder underlying the semiconductor device 1, it is effective to locate the projections 18 around the semiconductor device 1.

Referring to FIG. 7, by collectively disposing the projections 18 of metal block 15 around the fixing area of the semiconductor device 1, the projections 18 can be used as a bank for suppressing solder wetting expanse. Specifically, with respect to the main surface of the metal block 15, the peripheral parts of the projections 18 have a certain angle to cause a difference in wetting angle, which exhibits the effect of suppressing solder wetting expanse. Therefore, the use of lead-free solder of small wetting expanse will eliminate the formation of a solder resist for defining the area of solder expanse, thus leading to a reduction in the cost of manufacture.

As a method of forming the projections 18, pressing such as coining can be used. Pressing requires an extremely shorter machining time than cutting and has high productivity. In the formation of projections by coining, there may be utilized such a phenomenon that when convex parts on a metal mold are pressed against the metal block 15, the surroundings of the pressed areas are in relief like craters.

Alternatively, the same projections as described above or through-holes (which are not shown) may be provided in the lead frames 6 and 7. This produces the same anchor effect as described above, thereby strengthening adhesion among the lead frames 6, 7, the semiconductor device 1, and the metal block 15.

Referring to FIG. 6, a step 14*g* is provided on the wall surface facing to a void 14*f* within a casing projection part 14*e*. Thereby, the insulating distance at the step 14*g* is increased, and the insulating distance L4 between the heat sink 16 and external electrodes 6*b*, 7*b* and 13*b* can be ensured while suppressing the amount of projection of the casing projection part 14*e*.

Otherwise, the configuration is the same as that of the power semiconductor device in the second preferred embodiment, and its description is therefore omitted.

Fifth Preferred Embodiment

A fifth preferred embodiment is also a modification of the power semiconductor device in the second preferred embodiment. Specifically, part of a lead frame connected to a semiconductor device 1 is exposed from a main surface of a casing, as a radiation part. This increases the efficiency of radiation of the semiconductor device, thereby lowering its thermal resistance.

Figure 8:
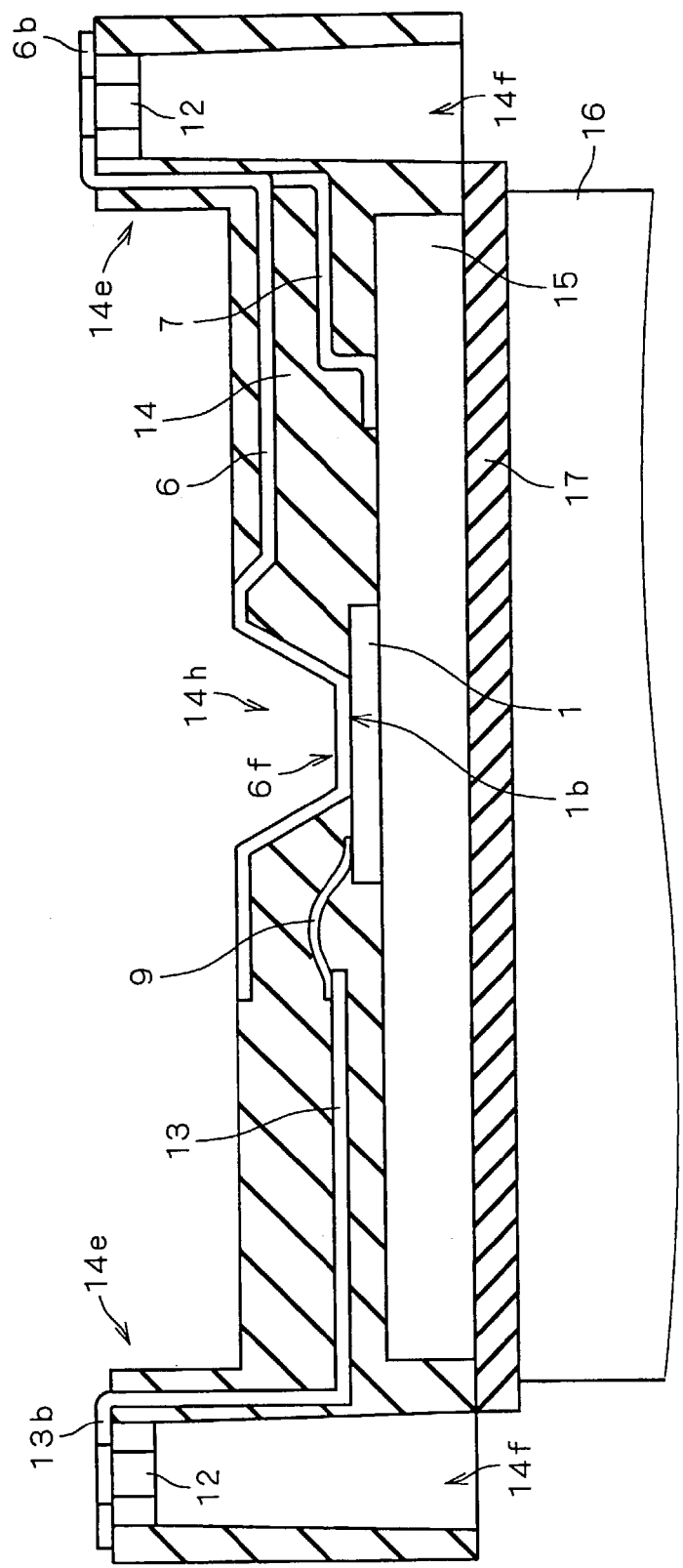
FIG. 8 is a sectional view showing a power semiconductor device according to a fifth preferred embodiment of the invention.

FIG. 8 shows a power semiconductor device according to the fifth preferred embodiment. In this embodiment, part 6*f* of a lead frame 6 fixed on a main electrode 1*b* of the semiconductor device 1 is exposed from part 14*h* of the main surface of the casing 14, as shown in FIG. 8.

This construction increases the radiation property on a surface 1*b* of the semiconductor device 1, and the efficiency of radiation of the semiconductor device 1 can be increased in combination with the radiation action of the metal block 15 and heat sink 16 on the bottom surface 1*a*. This permits a reduction in the thermal resistance of the power semiconductor device.

Specifically, since thermal resistance loss can be further reduced, power conversion characteristic cannot be lowered even if the area of the semiconductor device 1 is reduced. This enables to reduce the area of the semiconductor device 1 and increase the number of the semiconductor devices 1 obtainable per wafer, thus leading to a reduction in the cost. Alternatively, unless the area of the semiconductor device 1 is reduced, it is possible to increase the amount of electric power that can be processed by the semiconductor device 1, thus leading to improvements in the performance of the power semiconductor device.

The lead frame 6 of less thickness might fail to exhibit sufficient radiation effect and therefore it preferably has a thickness for example not less than 0.5 mm.

The reliability of the solder part can be improved by reducing the thickness of the vicinity of the part of the lead frame 6 fixed on the main electrode 1*b*, as previously described.

Referring to FIG. 8, the part 6*f* of the lead frame 6 that is the radiation part is a recessed area provided in the lead frame 6. The bottom part of the recess area is fixed on the electrode 1*b* in the surface of the semiconductor device 1.

As described in the first preferred embodiment, it is desirable that the joint part of the lead frame 6 be nested in the surface of the semiconductor device 1, without making contact with the peripheral part of the semiconductor device 1. For the reason for this, the part 6*f* of the lead frame 6 is shaped as the recess area.

In view of productivity, transfer molding preferably uses a metal mold that is constructed so as to mate the upper and lower metal molds. There is arranged such that the lead frame 6 has the recess area and the bottom part of the recess area is brought into contact with the electrode 1*b* on the surface of the semiconductor device 1. Therefore, when the upper and lower metal molds are shut, the upper metal mold will not directly contact with the part 6*f* of the lead frame 6 that faces to the semiconductor device 1. As the result, if the pressure for shutting the metal mold should be increased, the semiconductor device 1 is less subject to the pressure, thereby avoiding any adverse effect such as breakage. Accordingly, it is unnecessary to set the pressure of the metal mold to a small value. This makes possible to suppress burr etc., which might occur in the after-molding casing 14.

Although in this embodiment, the recess area in the lead frame 6 has the shape of an inverse trapezoid, it may be of any shape that can exhibit elasticity when mating the upper and lower metal molds.

Although there is the possibility that the mold resin runs in or burr grows to the recessed area of the lead frame 6, the both can be prevented by the following manner, for example. Transfer molding is performed after applying a flexible resin to the recessed area of the lead frame 6 or its surroundings, and the flexible resin is then removed.

Otherwise, the configuration is the same as that of the power semiconductor device in the second preferred embodiment, and its description is therefore omitted.

Sixth Preferred Embodiment

A sixth preferred embodiment is a modification of the power semiconductor device in the fifth preferred embodiment. Specifically, other metal block is fixed on the part 6*f* of the lead frame 6 that is the radiation part. This metal block functions as a heat spreader to diffuse the exothermic of the semiconductor device 1. This further increases the efficiency of radiation of the semiconductor device 1, thereby further increasing the thermal resistance of a power semiconductor device.

Figure 9:
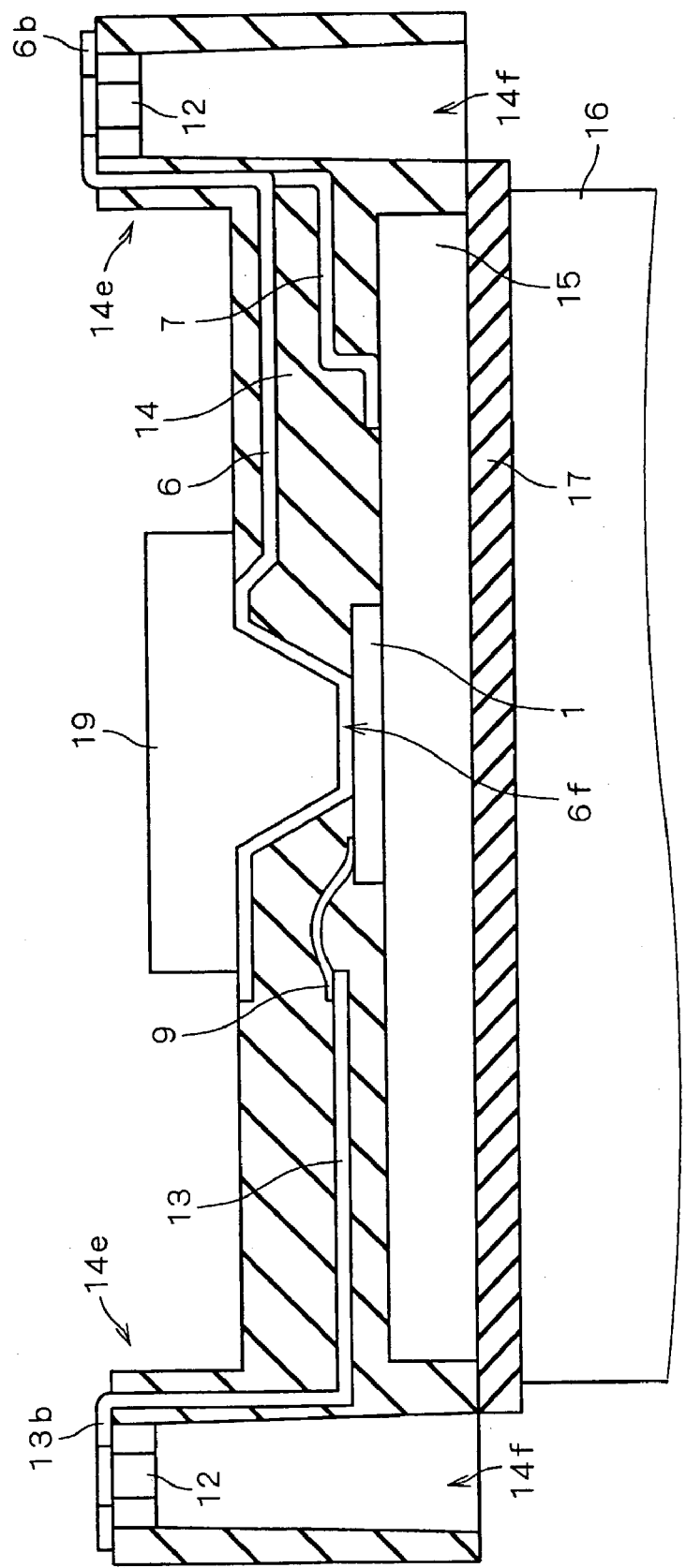
FIG. 9 is a sectional view showing a power semiconductor device according to a sixth preferred embodiment of the invention.

FIG. 9 shows a power semiconductor device according to the sixth preferred embodiment. The construction of FIG. 9 differs from that of FIG. 8 in that other metal block 19 is added. The metal block 19 is fixed on the part 6*f* of the lead frame 6 by soldering.

In this construction, the metal block 19 functions as a heat spreader to diffuse the exothermic of the semiconductor device 1. Thereby, the efficiency of radiation of the semiconductor device 1 can be further increased and the thermal resistance of the power semiconductor device can be further reduced.

The metal block 19 can be of any shape. The efficiency of radiation further increases by forming the metal block 19 with a thicker member than the lead frame 6 and tightly attaching it to the part 6*f* of the lead fame 6. The lead frame 6 preferably has a large thickness as previously described in the fifth preferred embodiment. If it should be difficult to increase that thickness, the radiation property can be maintained by increasing the thickness of the metal block 19, in accordance with the sixth preferred embodiment.

Like the metal block 15, the metal block 19 can be made of oxygen free high conductivity copper or any metal, e.g., SiC—Al, having a coefficient of linear expansion closer to that of Si than the lead frame 6. Thereby, the thermal stress exerted on the solder part is reduced and the reliability of the power semiconductor device is maintained for a long period of time.

Otherwise, the configuration is the same as that of the power semiconductor device in the fifth preferred embodiment, and its description is therefore omitted.

Seventh Preferred Embodiment

A seventh preferred embodiment is a modification of the power semiconductor device in the sixth preferred embodiment. Specifically, air-gap capable of holding a refrigerant (hereinafter referred to as "wick") is provided within the metal block 15 and other metal block 19. The refrigerant diffuses the exothermic of the semiconductor device 1. This increases the efficiency of radiation of the semiconductor device and thus permits a reduction in the thermal resistance of the power semiconductor device.

Figure 10:
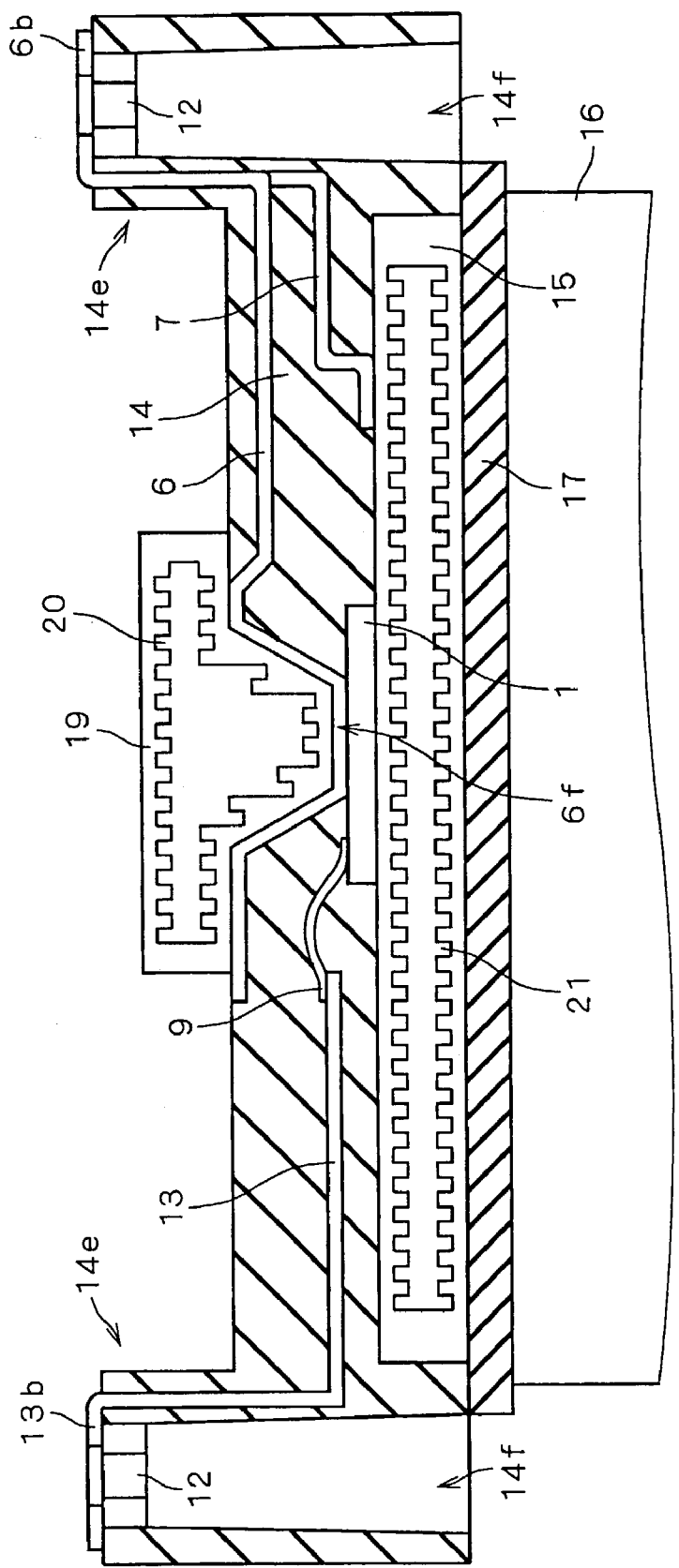
FIG. 10 is a sectional view showing a power semiconductor device according to a seventh preferred embodiment of the invention.

FIG. 10 shows a power semiconductor device according to the seventh preferred embodiment. Referring to FIG. 10, the configuration of this embodiment differs from that of FIG. 9 in that wicks 20 and 21 are provided within the metal block 15 and other metal block 19, respectively. The wicks 20 and 21 are filled with a refrigerant such as flon or its substitute, water, or air.

With the configuration that the wicks 20 and 21 are formed within the metal block 15 and other metal block 19, respectively, and the wicks 20 and 21 are filled with the refrigerant, the refrigerant immediately below the semiconductor device 1 absorbs the exothermic of the semiconductor device 1 and performs heat exchange with the exterior. More specifically, the thermal exchange takes place by boiling and cooling phenomena that when the refrigerant immediately below the semiconductor device 1 comes to the boil, it moves in a direction away from the semiconductor device 1 in the wicks 20, 21, and then it is liquefied upon contact with low temperatures.

Referring to FIG. 10, although the wicks 20 and 21 are shaped as an air-gap having a large number of ribs, they can be of any shape provided with such a small air-gap of a large surface area that can use capillary phenomena. For instance, they can be of such a structure that the metal block 15 and other metal block 19 are filled with a large quantity of air bubbles.

By disposing the wicks 20 and 21 filled with the refrigerant within the metal block 15 and other metal block 19, the refrigerant diffuses the exothermic of the semiconductor device 1. This increases the efficiency of radiation of the semiconductor device and thus permits a reduction in the thermal resistance of the power semiconductor device. When Mo alloy and SiC—Al are used as the material of the metal block 15 and other metal block 19 in order to increase the reliability of the solder part, there is the problem of increasing the thermal resistance of the power semiconductor device because their thermal conductivity is lower than that of Cu. According to the present invention, disposing the wicks 20 and 21 immediately near the semiconductor device 1 suppresses the thermal resistance of the power semiconductor device and reduces the area of the semiconductor device 1.

In the seventh preferred embodiment, the wicks 20 and 21 are of the type that performs thermal exchange by using phase change in the closed space. For instance, they can be of any type that is connected via piping to an external heat exchanger and performs thermal exchange by circulation of cooling water.

Otherwise, the configuration is the same as that of the power semiconductor device in the sixth preferred embodiment, and its description is therefore omitted.

Eighth Preferred Embodiment

An eighth preferred embodiment is a modification of the power semiconductor device in the first preferred embodiment. Specifically, there are plural sets of the semiconductor device 1, metal block 15, and lead frames 6, 7, 13, and all of the sets are integrally covered with the mold resin of the casing 14.

Figure 11:
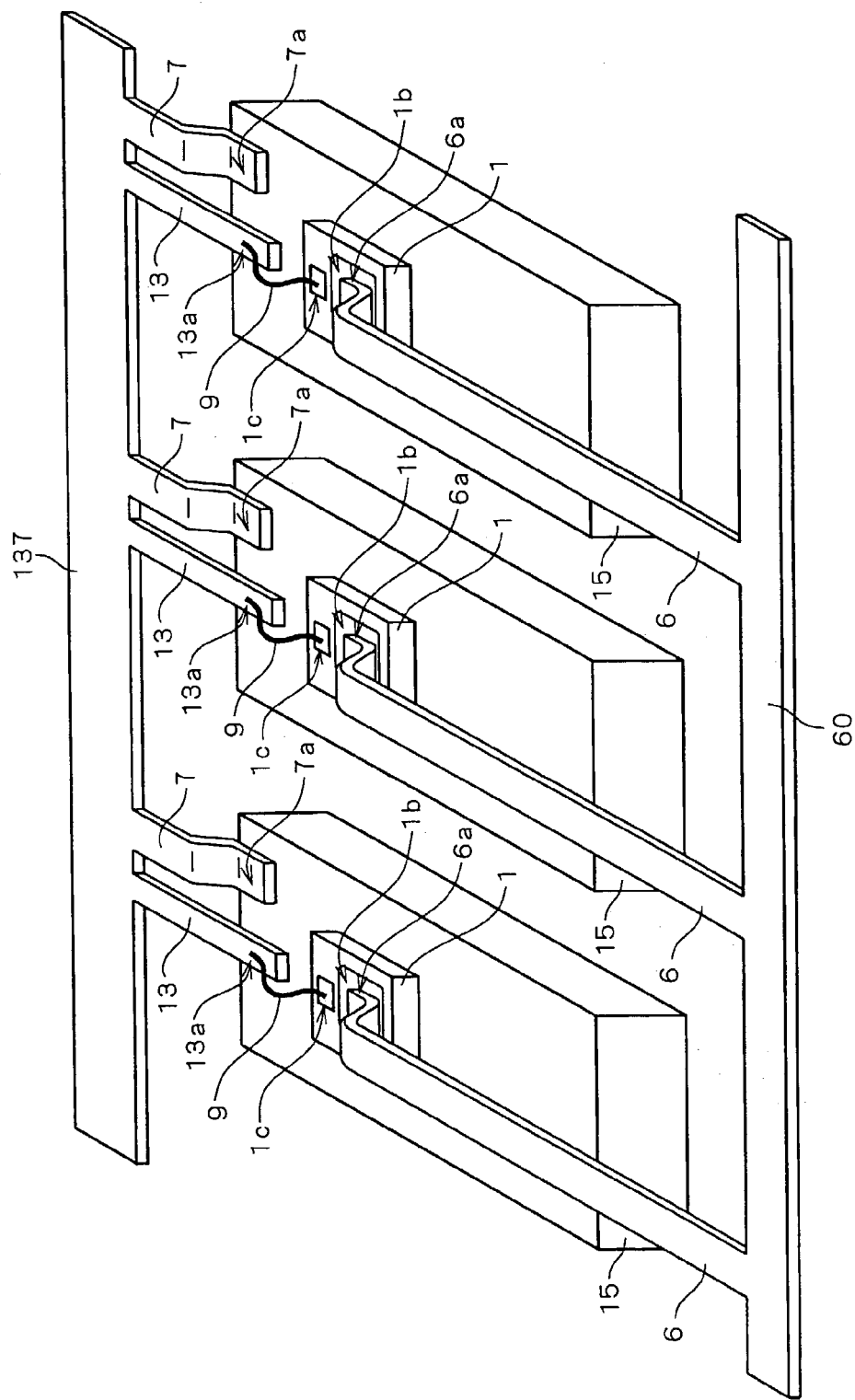
FIG. 11 is a perspective view before covering a power semiconductor device according to an eighth preferred embodiment of the invention with a mold resin.

FIGS. 11 and 12 show a power semiconductor device according to the eighth preferred embodiment. FIG. 11 is a perspective view before covering with the mold resin. FIG. 12 is a perspective view after covering with the mold resin.

Referring to these figures, there are plural sets of the semiconductor device 1, aluminum wire 9, metal block 15, and lead frames 6, 7, 13, which are shown in FIG. 2. The mold resin of the casing 14 integrally covers all of the sets. The configuration in FIGS. 11 and 12 differs from that of FIG. 2 in that the position of the lead frame 7 is in parallel with the lead frame 13, instead of the lead frame 6. Such a difference aims at merely showing that the lead frames 6, 7, 13 can be disposed arbitrarily.

By using the mold resin of the casing 14 for integrally covering the plural sets of semiconductor device 1, metal block 15, and lead frames 6, 7, 13, it is capable of realizing a compact module requiring plural semiconductor devices which is used for example in a three-phase inverter circuit.

Otherwise, the configuration is the same as that of the power semiconductor device in the first preferred embodiment, and its description is therefore omitted.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   a semiconductor device having a top surface and a bottom surface;
   a metal block having a bottom surface and a top surface adhered to said bottom surface of said semiconductor device;
   a lead frame fixed on said top surface of said semiconductor device; and
   a casing of a mold resin completely covering said semiconductor device and being in contact with said semiconductor device, covering at least a part of said top surface of said metal block around said adhered semiconductor device, and covering a part of said lead frame and being in contact with a part of said lead frame, wherein
   said bottom surface of said metal block is not exposed to an outside of said power semiconductor device by being covered with part of said casing or an insulating layer which is different from said casing,
   another part of said lead frame is exposed from a main surface of said casing as a radiation part, and
   said radiation part is a recessed area provided in said lead frame, a bottom part of said recessed area being fixed on said top surface of said semiconductor device.

2. The power semiconductor device according to claim 1 wherein
   another part of said lead frame is exposed from said casing as an external electrode, and said external electrode is disposed at a location projecting from a main surface of said casing in a direction normal to and away from a plane of said metal block on which said semiconductor device is fixed.

3. The power semiconductor device according to claim 2 wherein
said external electrode is disposed at a point inwardly from a side end part of said casing in said main surface of said casing.

4. The power semiconductor device according to claim 2 wherein
part of said casing projects from said main surface thereof,
said external electrode is disposed on said part of said casing,
an air-gap extending to said external electrode is disposed inwardly of said part of said casing, and
a step is disposed on a wall surface of said part of said casing facing to said air-gap.

5. The power semiconductor device according to claim 1 wherein
a projection is disposed on a plane of said metal block on which said semiconductor device is fixed.

6. The power semiconductor device according to claim 1 wherein other metal block is fixed on said radiation part.

7. The power semiconductor device according to claim 6 wherein an air-gap capable of holding a refrigerant is disposed in said other metal block.

8. The power semiconductor device according to claim 1 wherein an air-gap capable of holding a refrigerant is disposed in said metal block.

9. The power semiconductor device according to claim 1 wherein
there are plural sets of said semiconductor device, said metal block, and said lead frame, and
all of said plural sets are integrally covered with said mold resin of said casing.

10. The power semiconductor device according to claim 1 further comprising:
a heat sink on a side of the surface of said casing on which said metal block is disposed.

11. The power semiconductor device according to claim 1 wherein
said mold resin has a coefficient of linear expansion in the range of 20% different from that of said metal block.

12. A power semiconductor device comprising:
a semiconductor device having a top surface and a bottom surface;
a metal block having a bottom surface and a top surface adhered to said bottom surface of said semiconductor device;
a lead frame fixed on said top surface of said semiconductor device; and
a casing of a mold resin completely covering said semiconductor device and being in contact with said semiconductor device, covering at least a part of said top surface of said metal block around said adhered semiconductor device, and covering a part of said lead frame and being in contact with a part of said lead frame, wherein
said bottom surface of said metal block is not exposed to an outside of said power semiconductor device by being covered with part of said casing or an insulating layer which is different from said casing,
another part of said lead frame is exposed from said casing as an external electrode,
said external electrode is disposed at a location projecting from a main surface of said casing in a direction normal to and away from a plane of said metal block on which said semiconductor device is fixed,
part of said casing projects from said main surface thereof,
said external electrode is disposed on said part of said casing,
an air-gap extending to said external electrode is disposed inwardly of said part of said casing, and
a step is disposed on a wall surface of said part of said casing facing to said air-gap.

13. A power semiconductor device comprising:
a semiconductor device having a top surface and a bottom surface;
a metal block having a bottom surface and a top surface adhered to said bottom surface of said semiconductor device;
a lead frame fixed on said top surface of said semiconductor device; and
a casing of a mold resin completely covering said semiconductor device and being in contact with said semiconductor device, covering at least a part of said top surface of said metal block around said adhered semiconductor device, and covering a part of said lead frame and being in contact with a part of said lead frame, wherein
said bottom surface of said metal block is not exposed to an outside of said power semiconductor device by being covered with part of said casing or an insulating layer which is different from said casing, and
an air-gap capable of holding a refrigerant is disposed in said metal block.

* * * * *